United States Patent [19]

Bell et al.

[11] Patent Number: 4,929,890
[45] Date of Patent: May 29, 1990

[54] SYSTEM FOR OBTAINING DIGITAL OUTPUTS FROM MULTIPLE TRANSDUCERS

[75] Inventors: Robert L. Bell, Agoura Hills; Herman L. Renger, Calabasa, both of Calif.

[73] Assignee: Bell Microsensors, Inc.

[21] Appl. No.: 118,294

[22] Filed: Nov. 6, 1987

Related U.S. Application Data

[62] Division of Ser. No. 895,904, Aug. 11, 1986, Pat. No. 4,732,043.

[51] Int. Cl.$^5$ ............................................. G01R 23/02
[52] U.S. Cl. ................................ 324/78 R; 324/78 D; 328/133
[58] Field of Search ................. 324/77 R, 77 D, 78 R, 324/78 D, 78 Z, 79 R, 79 D; 328/133, 134, 136, 140, 141; 364/484

[56] References Cited

U.S. PATENT DOCUMENTS

| 4,004,137 | 1/1977 | Schroder | 324/78 D |
| 4,090,133 | 5/1978 | Klyce et al. | 324/78 D |
| 4,301,405 | 11/1981 | Carlson | 324/78 D |
| 4,326,261 | 4/1982 | Peoples | 324/78 D |
| 4,330,746 | 5/1982 | Stulting | 324/79 D |

Primary Examiner—Michael J. Tokar
Attorney, Agent, or Firm—Alton W. Payne

[57] ABSTRACT

A method and apparatus are disclosed for deriving digital signals from analog variations of different sensing elements in a transducer. Each sensing device controls the frequency of a variable frequency oscillator, which is energized when a reading is to be taken for that specific sensing device. The periodic signal is coupled to a first counter which counts a presettable total number of cycles so as to establish a variable time period proportioned to the value represented by the then existing state of the sensing device. Concurrently, a second counter is operated for a like time interval, but counts cycles from a fixed frequency clock source at a much higher frequency. The number of cycles counted by the second counter is proportional to the analog signal from the sensing device. This arrangement enables the analog signals from the sensing devices to be digitized in sequence with compact circuitry having low power drain. The different values derived from the sensing device can be used in complex analysis of one or more parameters that are being evaluated, without danger of interharmonics, cross talk or interference between the different units. By changing the presettings of the first counter, the resolution of the transducer can be varied, enabling operation in different ranges with adequate accuracy. Also, where a number of sensing elements are used in a transducer, resolution can be selectively varied when digitizing readings from the different elements.

5 Claims, 3 Drawing Sheets

SYSTEM FOR OBTAINING DIGITAL OUTPUTS FROM MULTIPLE TRANSDUCERS

This is a divisional of co-pending application Ser. No. 895,904 filed on Aug. 11, 1986, now U.S. Pat. No. 4,732,043.

BACKGROUND OF THE INVENTION

This invention relates to electronic systems for determining the values of a number of analog sensors and more particularly to systems for rapidly and economically providing digital readings from small, precision transducer systems.

Transducers, such as capacitive, resistive, or inductive pressure transducers, generate signals in response to minute displacements of a movable element. In a pressure transducer as disclosed in U.S. Pat. No. 4,562,742, for example, the total excursion of a flexible sensing diaphragm may be no more than 0.001". This minute deflection range is used in order to achieve better linearity and lower hysteresis and must be accurately converted to analog or preferably digital readings. In this type of device, sensing and reference electrodes on the sensing diaphragm provide capacitive pairs which may be utilized to control the frequency of associated oscillators. These oscillators in turn may be utilized to generate digital counts from which precise pressure readings may be computed for automatic control or data processing purposes. The combination of transducer and signal generator are usually referred to as a "transmitter".

Some problems, however, arise in using variable frequency oscillators in systems and transmitters of this type, stemming from practical considerations of design, including physical size, resolution, power consumption, reliability and cost. Integrated circuit techniques are generally utilized in the fabrication of the oscillators and associated electronic circuits, in order to reduce size and power requirements. In the great majority of process control and instrumentation system applications, transducers are confined within protective sealed primary enclosures receiving fluids whose pressures are to be measured. The transducer electronics, including digitizing means, are incorporated in very limited space within attached secondary enclosures that are also sealed, explosion proof and vibration resistant. The transducer and electronics form a "transmitter" suitable for use in any typical industrial system.

However, closely adjacent variable frequency oscillators can interfere with each other in a number of ways, such as by cross-talk or by locking in phase at a fundamental frequency, or at a harmonic or sub-harmonic of the fundamental. The use of signal and device isolating techniques can reduce cross-talk and frequency lock-in tendencies, but at a substantial increase in cost, and even so may not completely eliminate the problem.

A common approach to the problem of oscillator interaction has been based on selecting frequencies of operation for the oscillators such that the harmonics as well as fundamentals are well spaced from each other. However, this approach increases the complexity and expense involved, and is impractical when it is desired to limit total bandwidth or to use a substantial number of oscillators. In addition, such oscillators can vary somewhat in response to temperature and other conditions, so that minor but perhaps cumulative errors can be introduced when a number of oscillators are used.

High resolution, insensitivity to temperature and static pressure changes, and low power drain are other features which must be attained at reasonable cost for the majority of practical applications. This requires high bit resolution in the coupling system, stability in the oscillator system, and circuit accuracy throughout the calibrated span of the device. Analog-to-digital converters of high resolution could be used for sensing the analog signal levels, but only at inordinate expense. Variable frequency oscillators having very high central frequencies can also be used, but require too much power as well as being too costly, while not avoiding the problem of possible frequency lock-in.

An important capability for a transmitter based on a sensitive transducer would be responsiveness, with high resolution, in any of a number of pressure ranges. Thus a differential transducer that could accurately digitize differential pressure readings at ranges of 10" $H_2O$ maximum, 100" $H_2O$ maximum and 750" $H_2O$ maximum (plus or minus) would have great value in terms of increased versatility and reduced inventory. These are typical figures used in industrial process situations. The prior art has heretofore usually required separate transducers for these applications, although more recently "smart" transmitters have been used which have enabled, through signal processing, some extension of range. However a ratio of about 1.6 is the maximum that has been achieved by "dumb" transmitters There is consequently a significant need for an economic and reliable method and apparatus for converting small signal variations into reliable digital outputs over a wide dynamic range. There is a particular need for providing this function within the volumetric, power and cost constraints imposed on modern transducer systems.

SUMMARY OF THE INVENTION

In accordance with the present invention, a number of sensing devices generating analog signals, such as capacitive sensors in a pressure transducer, are coupled to control the frequency of an associated variable frequency oscillator. A control system, typically a microprocessor, governs the sequencing of signals applied to activate different circuitry for providing periodic signals. The output from an activated oscillator is coupled to a digital counter system in which a first counter operates, responsive to a control input, to count a predetermined number of cycles from the selected oscillator. The first counter thus averages the frequency of the selected oscillator over its active interval. The time required for the first counter device to reach a predetermined count is a precise measure of the average value of the given variable. This interval is used to define the duration of a gating signal that gates pulses from a clock source operating at a much higher fixed frequency. A second counter receives the gated pulses and provides a digital value of high resolution corresponding to the analog signal input. The different input source are thus scanned in turn to digitally represent the signal levels of the different transducers. This combination enables the circuitry to be closely juxtaposed within an enclosure and operate with low power demand to provide high resolution outputs at useful sampling rates.

In one example of such a system a number of signal transducers, such as capacitors and resistive sensors, are separately and sequentially coupled to different ones of a number of variable frequency oscillators, the outputs of which are successively applied to the dual counter system. In another example the analog input signals are time multiplexed to control a single variable frequency oscillator in successive intervals.

Transmitters in accordance with the present invention use adjustment of the preset nominal time interval to enable useful high resolution readouts to be obtained within widely varying ranges of analog values. Thus, where a low pressure range is being sensed, the analog signal varies relatively little but by lengthening the time interval the number of high frequency counts, and thus the resolution, is increased. Corresponding adjustments can be made for any selected range, enabling the ratio of highest to lowest pressure ranges to be increased to about 75. Further, where the readings from multiple sensors are used to derive a computed value, the preset nominal time intervals can be arranged to give highest resolution for the most meaningful inputs.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
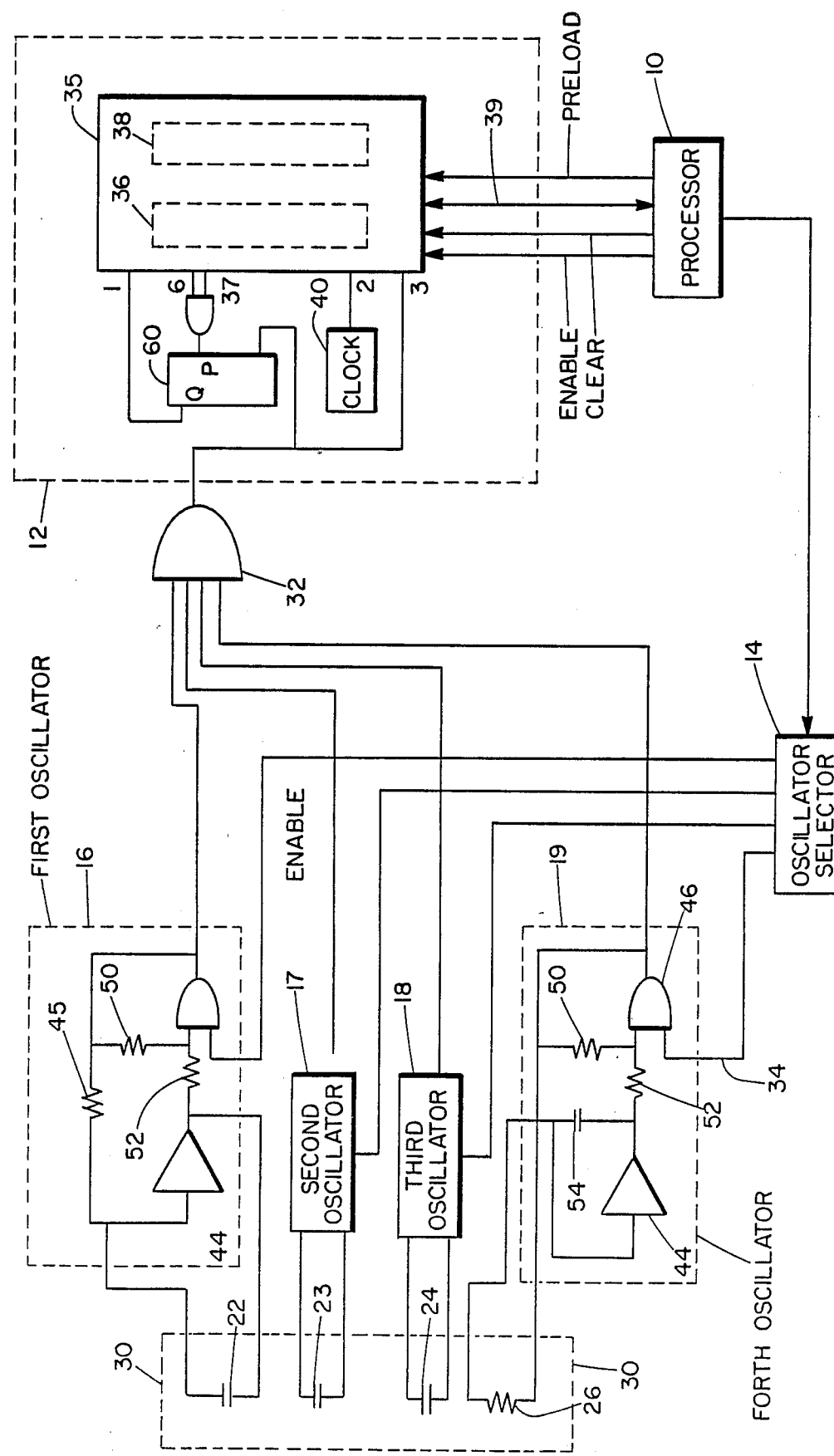
FIG. 1 is a combined block and schematic diagram of a system for converting a number of analog signals to digital values in accordance with the invention.

In accordance with the invention, a method and apparatus are disclosed for simply and economically determining, to a high degree of accuracy and with low power demand, signal values at a number of associated sensing devices. Referring to FIG. 1, a processor 10 constitutes a control subsystem which functions to orchestrate and monitor the operation of the system, as more fully discussed hereinafter. Although a typical commercially available microprocessor is used because of its capability for versatile operation at low cost, a hardwired circuit or a custom IC of specific capability may be employed as other alternatives. The processor 10 is bidirectionally coupled to a counter system, here termed a digital generator 12, with which it exchanges signals for operation in a sequence of modes or phases. The processor 10 is also coupled to an oscillator selector 14, which produces signals to enable operation of any one of "n", here first through fourth oscillators 16, 17, 18 and 19, respectively. The oscillators 16–19 are each variable frequency devices whose frequency control inputs are coupled to receive analog signals from a different sensing element. The sensing elements here are three different pressure responsive capacitors 22, 23 and 24, and a temperature sensitive resistor 26.

Each of the elements 22–24 and 26 is part of a multi-element transducer, such as a pressure responsive capacitive transducer 30 (shown only generally) to which one or more variable pressure fluids are applied. Typically the transducer 30 includes a deformable, pressure responsive diaphragm and the pressure sensing elements 22–24 are formed by spaced apart electrodes whose gaps vary as the diaphragm is variably deflected in response to pressure. Changes in the values of capacitance of the capacitors 22–24 result in corresponding changes in the frequency of operation of the associated oscillators 16, 17, and 18 respectively. The resistor 26 that is associated with the fourth oscillator 19 is responsive to the temperature level within the pressure transducer 30, and changes the frequency of the fourth oscillator 19 correspondingly.

As will be recognized by those skilled in the art, a wide variety of voltage variable oscillators using different passive circuit combinations of inductance, capacitance and resistance can be utilized in these systems. However, it is preferred to use an oscillator configuration having a center frequency in the range of 5 KHz to 500 KHz, because of noise and stability factors that affect practical designs. More specifically, center frequencies of about 50 KHz are employed in order to approach optimal noise and stability characteristics. The long sampling times that would otherwise be needed for high resolution counts (of the order of one million) are obviated by combinations in accordance with the invention.

Examples of pressure transducers with which systems in accordance with the present invention are used include the gauge pressure device of Bell U.S. Pat. No. 4,295,376 and the differential pressure device of patent application Ser. No. 750,769, filed July 1, 1985 and entitled "Differential Pressure Transducer". Although these transducers have different configurations and operative characteristics they have in common the objective of attaining extremely precise readings using minutely deflected elements, a number of sensors, and circuit leads within a primary housing.

Output signals from the oscillators 16–19 are coupled to the digital generator 12 by an AND gate 32. As shown with the first oscillator 16, each oscillator has an ENABLE terminal 34 for receiving a signal from the oscillator selector 14, such that only one oscillator of the group is operated at any one time. Whichever oscillator 16, 17, 18 or 19 is running provides periodic signals through the AND gate 32 to the digital generator 12. The output signals from non-activated oscillators are high to enable the other inputs to the AND gate 32. The digital generator 12 comprises a two counter ($2 \times \neq$) integrated circuit 35 which includes a first counter 36 and a second counter 38 intercoupled in particular ways. This counter circuit 35 advantageously comprises a National Semiconductor Corp. type 810A. However, other counter devices based on integrated circuit chips of commercial or custom design may be employed. Twenty-four bit counters may be used to advantage where the resolution required justifies the cost.

The first counter 36 is preloaded from the processor 10. The second counter 38 is also enabled, until an overflow occurs at the first counter 36 to count pulses from a high speed clock source 40 in the digital generator 12. The high speed clock source 40 has a fixed frequency output in the range from 1 MHz to 10 MHz, here being at 2 MHz. Outputs from the second counter 38 are coupled in parallel via a multi-line connection 39 to the processor 10, and are determinative of each sensed value in series. When a reading has been taken for a given variable capacitor or resistor, the processor 10 resets the counters 36, 38 for the next reading.

Both the digital generator 12 and the processor 10 are mounted within the secondary enclosure attached to the primary enclosure for the transducer 30, and are comprised of commercially available standard or custom semiconductor devices. For example, the processor may be a type MC146805E3 microprocessor manufactured by Motorola Semiconductor Products, Inc. of Austin, Tex. The oscillator selector 14 may comprise conventional logic inputs for converting 2 or 3 bit parallel input signals to one out of four output signals. In this instance it is preferred to use three parallel input lines, so that a separate combination of input signals can be used to disable all four oscillators 16–19.

The first oscillator 16 includes, as a component element, the variable capacitor 22 which has a capacitance of the order of 100 PF in this example. The active elements are a series connected inverter 44 and a two input OR gate 46, which may be integrated circuits of types 4069 and 4071, respectively, manufactured by Motorola Semiconductor Products, Inc. The variable capacitor 22 of the transducer 30 is coupled in shunt between the input and output of the inverter 44, with a feedback resistor 48 coupling the output of the two input OR gate 46 to the input of the inverter 44. One input of the OR gate 46 receives the output of the inverter 44 via a resistor 52, and is also coupled by a shunt resistor 50 to the feedback line. The other input of the OR gate 46 is coupled to receive an enable signal from the oscillator selector 14. The enable signal applied to the OR gate 46 returns a voltage to the input of the inverter 44, so that the circuit 16 oscillates at a frequency determined by the value of the capacitance of the variable capacitor 22. Here the center frequency is selected to be 50 KHz, as discussed above. If it is desirable to have all oscillators operate on precisely the same frequency, the shunt and load resistors 50, 52 are made adjustable or individually adjusted for this purpose.

In the fourth oscillator 19, the inverter 44 and two input OR gate 46 are arranged with the resistors 50, 52 as previously, but the feedback resistor comprises the variable resistor 26 within the transducer, which has a mid range value of approximately 250 kilohms. A 100 PF capacitor 54 is coupled to shunt the input to the output of the inverter 44, thus providing an oscillatory circuit. Here, however, the frequency is determined by the value of the variable, temperature responsive, resistor 26, although the center frequency remains at approximately 50 KHz.

The need to run the four oscillators at somewhere between 5 KHz and 500 KHz is due in part to limits on stability and noise of these types of oscillators. Running at 50 KHz is close to optimal in this regard. However to get high resolution (1,000,000 counts) for four different oscillators would require more than one minute. By using the 50 KHz signal to time the interval of a 2 MHz signal such resolution can be obtained in about one second.

In the digital generator 12, an NSC type 810 2×16 bit counter 35 is preferred to provide the functions of the two counters 36, 38, because it further readily coacts with logic circuits for providing enabling and resetting functions. Various terminal connections designated (1), (2), . . . (37) to correspond to the manufacturer's designations are shown as they are specifically interconnected in this example. Thus a D-type input flip-flop 60 is set to enable both counters 36, 38. Inputs from the AND gate 32 are counted at the first counter 36 as high frequency clock pulses from the source 40 are counted at the concurrently enabled second counter 38. The processor 10 initially preloads the first counter 36 to a predetermined value. Count inputs are used to decrement the first counter 36 until it returns to zero, at which point in time the enable signal at the second counter 38 is terminated. A signal having a corresponding meaning is sent to the processor 10, which recognizes that the counting cycle is over. In the interim, any overflow from the second counter 38 has been counted by the processor 10. At this point, therefore, the processor 10 can read the final count established in the second counter 38, together with any overflow. The count plus overflow precisely represents in digital form the duration of the interval during which the first counter 36 reached the predetermined count. Alternatively, of course, the processor may monitor an incrementing count at the first counter 36, starting from zero or some other number, so that when a given count is reached the number of high frequency pulses plus overflow recorded at the second counter 38 will again provide a digitized output representative of the value of the capacitance or resistance at the sensing element. By using a 16 bit second counter 38 and counting any overflow, the effective range of the counter 38 is extended beyond 16 bits (a 64 K count) to over a million counts (greater than 20 bit resolution).

Using the NSC 810A 2×16 bit counter, the output signal from the AND gate 32 is applied to the clock input of the D-type flip-flop 60, the Q' output from which is coupled to the (1) input of the counter 35. The AND gate 32 output is also applied to the (3) input of the counter 35, the (2) input of which receives signals from the clock source 40. The D input to the flip-flop 60 receives signals from terminals (6) and (37) of the bit counter through a two input NOR gate 62.

Figure 2:
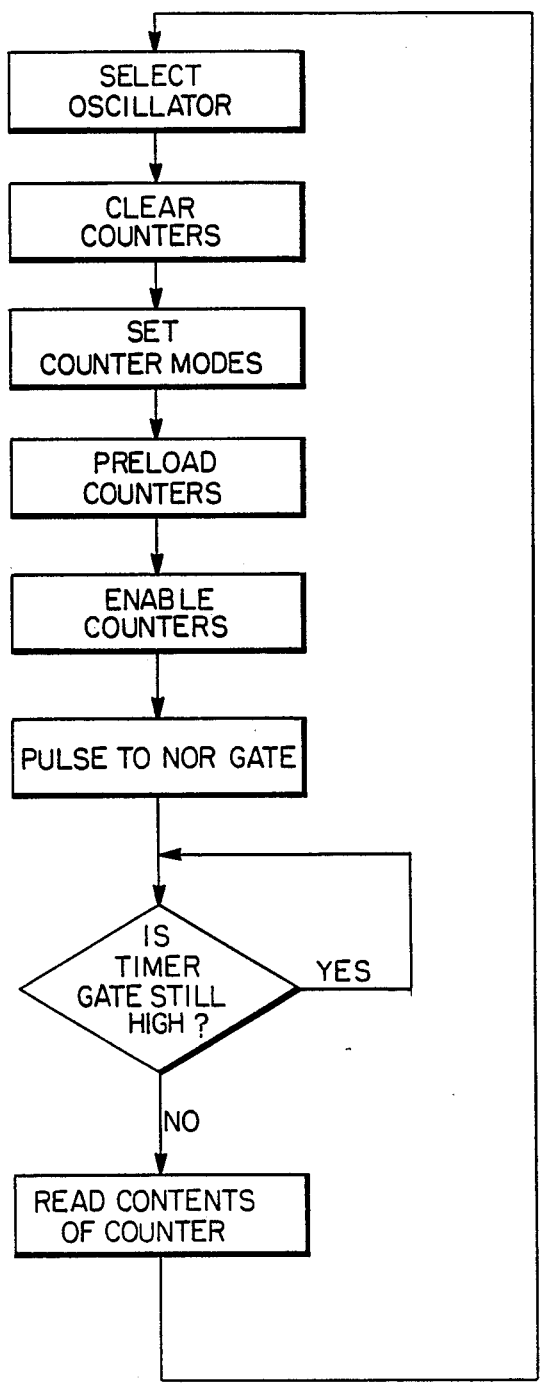
FIG. 2 is a graphical representation of the sequence of functional steps performed in the operation of the apparatus of FIG. 1.

The manner in which processor 10 orchestrates the operation of the system of FIG. 1, and in which different readings are taken without interference or cross talk, will be more evident with reference to FIG. 2 as well as FIG. 1. The processor 10 first selects an oscillator 16–19 by providing an enabling signal at the enable input 34. It then presets the counters 36, 38 by providing preset data to each concurrently. With a selected oscillator, say oscillator 16, enabled, the internal circuit begins to generate a frequency determined by the associated sensing device, here the variable capacitor 22. These pulses are not counted until the individual counters 36, 38 have been preconditioned. The NSC type 810A counter 35 that is used here has different available modes of operation, as is well known to those skilled in the art. For example, mode 4 can be used for the first counter 36 and mode 2 for the second counter 38, with a preloaded count (e.g. 0712 hex) being set into the first counter 36 and a different count (FFFF hex) being preloaded into the second counter 38. In this specific example the second counter 38 is also decremented down, and the actual count is obtained by inverting the count reached.

The number 0712 hex provides a count interval duration of approximately 45 milliseconds at the mid-range frequency of the associated oscillators. The count of FFFF hex in the second counter 38 is the equivalent of using 0000 for an up counter. By counting any overflow, the second counter 38 provides more than adequate range for each selected sensing device.

In this example, then, the counters 36, 38 are operated to decrement down from the starting value. The counters 36, 38 are then enabled, as by writing a 1 followed by a 0 from the processor 10 in the C register associated with the 2×16 bit counter, to enable counting to take place with both counters On the occurrence of the next low-to-high transition in the signal from the OR gate 32, the counters 36, 38 begin to count the pulses applied thereto. The counter returns a signal on terminal 6 to maintain the flip-flop in the enabled state.

Thus, during enablement of the first and second counters 36, 38, relatively slow speed counting is taking place at the first counter 36, while a much higher value is being accumulated at the second counter 38. This results from the fact that the input pulse rates are almost two orders of magnitude different (50 MHz v. 2 MHz). When the first counter 36 reaches zero, it stops counting and the signal from terminal 6 terminates, so that the next low-to-high transition in the input signal to the digital generator 12 changes the state of the D-type flip-flop such that the second counter 38 is no longer enabled, and stops counting. The processor 10 monitors any overflow as well as this signal (or alternatively terminal (3) of the 2×16 bit counter 35), and when the timer gate signal terminates, reads and then inverts the contents of the second counter 38. Because the time interval required to reach the predetermined count in the first counter 36 is precisely related to the value of the sensing element, and because the second counter 38 is correspondingly precisely related, the output of the second counter 38 is a high resolution reading of the setting or value of the sensing element.

In like manner, therefore, the processor can operate the successive oscillators 17, 18 and 19 in sequence, each time presetting and then reading the values in the digital generator 12. Consequently, only one high frequency clock 40 is required and the arrangement can be incorporated with high circuit density within the secondary enclosure for the transducer 30. Inasmuch as the oscillators are not run concurrently at any time, there is no cross talk or interference problem. Further, the frequency of oscillation can be set at any value commensurate with size and power requirements, which are relatively low.

Transducer devices utilizing systems in accordance with the invention can operate repetitively at a suitable cycle rate using readings from the different pressure and temperature sensitive devices to generate a very precise calculated value. The cycle rate here is typically well under one second per integrated reading, which is more than adequate for most pressure sensing applications. An arbitrary number "n" of oscillators can be used if more sensors are to be incorporated in the system.

In a transducer 30 using a number of sensor elements, the present invention enables digitization to take place with different resolutions for the various elements. In a capacitive differential pressure transducer, for example, the greatest significance is attached to the capacitance readings derived from the two pressures on opposite sides of the sensing diaphragm. The reference pressure reading and the temperature reading are useful but need not be as accurate. Thus in accordance with the invention the first counter 36 is preset for the two principal pressure readings with a higher nominal value (defining a longer time interval) than for the reference pressure and temperature readings. Consequently, regardless of how the actual analog signal varies from the nominal, a higher count is obtained from the second counter 38 and greater resolution is achieved. The processor 10 factors in the change in nominal time interval when performing the final computation.

The capability for selecting different resolutions is also utilized to enable a given transmitter to function with high resolution in different pressure (or other operative variable) ranges. The adjustment is made principally in accordance with the range of signal variation, the degree of resolution desired and the amount of time available. For differential pressure transducer operation at a maximum of 750" $H_2O$, a "sensor span" of 7.5% (difference between high and low values) is typical. If the nominal time interval is set to give 150,000 counts, this means that the counts between the limits vary by 11,250, which gives a resolution of 0.009%. Relative to this, for 100" $H_2O$ maximum one would have a sensor span of 1.0%, use a 600,000 nominal count and obtain a 0.016% resolution, while at 10" $H_2O$ maximum the count would have lengthened to 1,200,000 and the resolution would be 0.083%. Each of these figures provides higher resolution than heretofore attained, but the ability to provide such performance from a given transmitter is unique.

Figure 3:
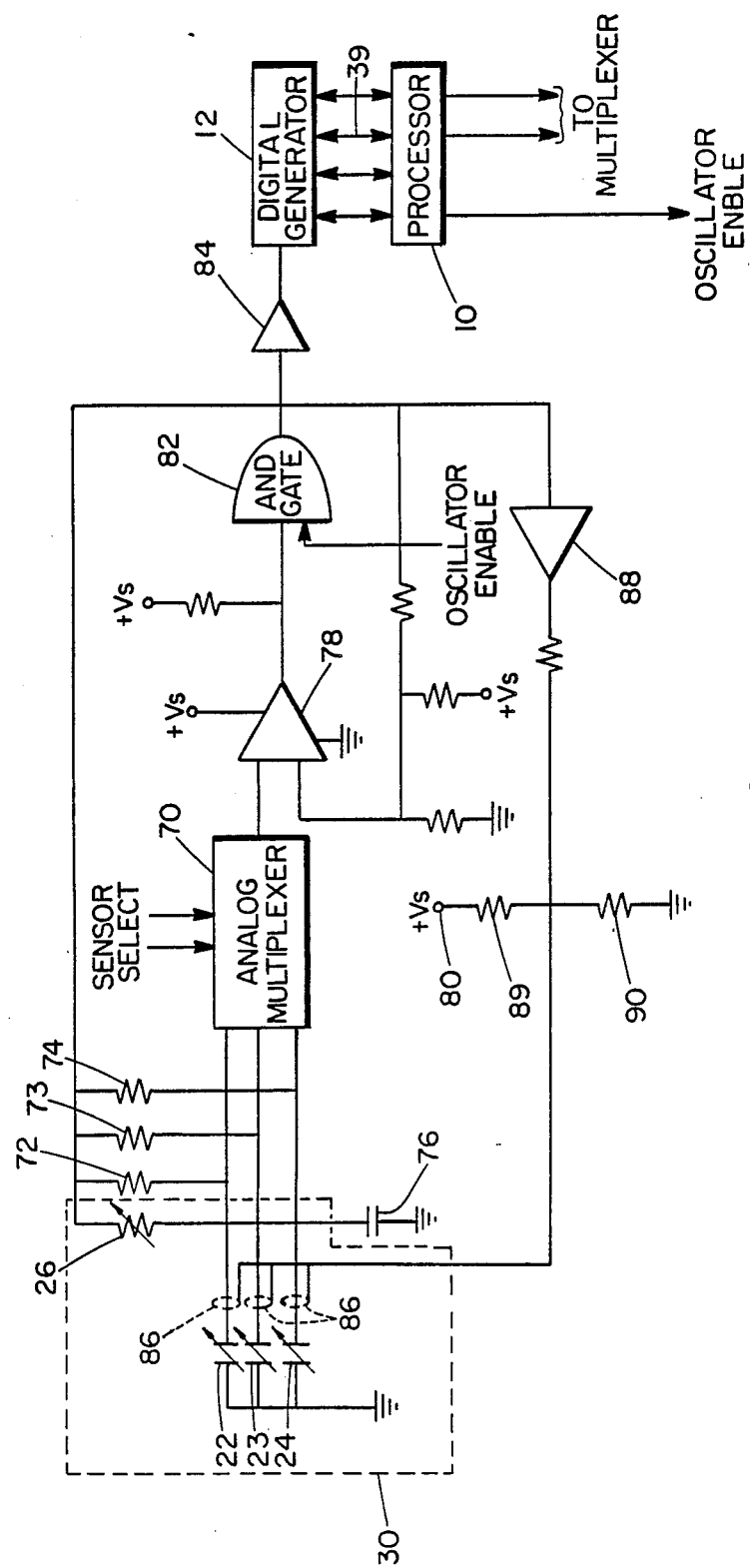
FIG. 3 is a combined block and schematic diagram of a variation of the system of FIG. 1, in which a single variable frequency oscillator is used.

As shown in FIG. 3, a multiplexing arrangement may be utilized, in which different capacitive and resistive sensors are coupled into a single oscillator circuit in succession. The transducer 30' again comprises a set of three variable capacitance elements 22', 23', 24' and a thermistor 26', each of which couples into a different input of a four input, single output analog multiplexer 70 of integrated circuit type, here part number 74 HC 4052. Each of the capacitances 22', 23', 24' is coupled to a feedback path via a separate stable timing resistor 72, 73 or 74 respectively. The thermistor 26' is in the feedback loop to the multiplexer 70, but shunted by a fixed timing capacitor 76 coupled to ground. The multiplexer 70 is controlled by digital signals on two parallel lines from the processor 10, which uses a two binary digit combination to select sensors in sequence at appropriate times. The oscillator circuit comprises the selected passive R-C circuit combination at the multiplexer input (e.g. first variable capacitance 22' and associated timing resistor 72), a comparator amplifier 78 which receives the multiplexer 70 output at its minus input and a reference voltage from the midpoint of two equal resistors dividing the voltage a $+V_s$ source 80 relative to ground, and an output from AND gate 82 at its plus input. The AND gate 82 is enabled by the processor 10 in order to pass pulses to be counted to the digital generator 12 through an amplifier 84.

A guard voltage circuit is also employed that merits mention here because it aids in stabilizing the characteristics of signals derived from the transducer 30'. Each capacitor sensor 22', 23', 24' includes an adjacent reference or guard electrode 86 (shown only generally) which when coupled to a reference, such as ground potential, minimizes stray and A.C. fluctuations. However, because of the high resolution sought, changes of capacitance arising from any unwanted cause can affect the readings adversely. Here output signal fluctuations from the AND gate 82 are taken through a buffer amplifier 88 back to the guard electrode 86, tied to the voltage level defined at the midpoint of a pair of voltage dropping resistors 89, 90 between the $+V_s$ source 80 and ground. This use of a signal following reference minimizes response of the sensing capacitances to circuit variations and device geometries.

In the operation of the circuit of FIG. 3, any sensing capacitance, e.g. 22', and its associated timing resistor, e.g. 72, is coupled in circuit with the comparator amplifier 78 when selected by the proper two binary digit combination from the processor 10 controlling the analog multiplexer 70. Variable frequency clock signals arising from signal oscillation do not appear at the output, however, until the processor 10 enables one input of the AND gate 82. When this happens, the digital generator 12 and processor 10 undertake to define the time interval and determine the high resolution count, as previously described in conjunction with FIGS. 1 and 2. When one conversion of sensor analog indication to digital output has been accomplished, the multiplexer 70 is controlled to select another sensor, and so on.

This arrangement not only reduces the number of oscillators needed, in exchange for a multiplexer, but has particular benefits as to circuit stability. Inasmuch as only passive elements are changed when switching from one sensor to another, the drift tendencies inherent in oscillators do not give rise to differences as the sensors are changed.

Although a number of a modifications and expedients have been shown it will be appreciated that the invention is not limited thereto but encompasses all forms and variations within the scope of the appended claims.

What is claimed is:

1. Apparatus for determining the frequency of an oscillator, comprising:
   means for generating enabling commands including means for receiving count data;
   first counter means responsive to the enabling command for counting a preselected number of oscillations of the oscillator, and said first counter means can be preset to a given value such that the resolution of the reading of the frequency can be varied and producing an indication when the preselected number of oscillations have occured;
   high frequency clock means having a frequency higher than the oscillator; and
   second counter means coupled to the means for generating commands and responseive to signals from the clock means and the indication produced by the first counter means for counting signals from the clock source which occur subsequent to the command and prior to the indication, and wherein the means for generating commands presets the second counter means and is responseive to both overflows and the final count from the second counter means, such that the second counter means can provide a higher resolution count than its nominal capacity.

2. The invention as set forth in claim 1 above, wherein the means for generating commands presets at least the first counter means to a predetermined count, and wherein the first counter means is coupled to decrement in response to oscillations of the oscillator, to reach a zero count constituting the indication when the preselected number of oscillations have occurred, wherein the oscillator has a central frequency in the range of approximately 5 KHz to 500 KHz and wherein the clock means has a fixed frequency in the range of approximately 1MHz to 10 MHz.

3. The invention as set forth in claim 2 above, wherein the first and second counter means comprise parts of a dual multi-bit counter device.

4. The invention as set forth in claim 1 above, wherein the apparatus comprises a number of oscillators and further includes means for successively coupling different ones of the oscillators to the first counter means.

5. The invention as set forth in claim 1 above, wherein the apparatus comprises a variable frequency oscillator and a number of analog devices providing independent amplitude signals, and multiplexer means for successively coupling different ones of the analog devices to the variable frequency oscillator.

* * * * *

Disclaimer and Dedication

4,929,890—*Robert L. Bell*, Agoura Hills; *Herman L. Renger*, Calabasa, both of Calif., SYSTEM FOR OBTAINING DIGITAL OUTPUTS FROM MULTIPLE TRANSDUCERS. Patent dated May 29, 1990. Disclaimer and Dedication filed Sept. 6, 1991, by the assignee, Bell Microsensors, Inc.

Hereby disclaims and dedicates to the Public the term of this patent subsquent to Sept. 1, 1991.
[*Official Gazette February 18, 1992*]